US012635567B2

(12) United States Patent
Parekh et al.

(10) Patent No.: US 12,635,567 B2
(45) Date of Patent: May 19, 2026

(54) SUBSTRATE FOR VERTICALLY ASSEMBLED SEMICONDUCTOR DIES

(71) Applicant: Micron Technology, Inc., Boise, ID (US)

(72) Inventors: Kunal R. Parekh, Boise, ID (US); Bret K. Street, Meridian, ID (US); Kyle K. Kirby, Eagle, ID (US); Wei Zhou, Boise, ID (US); Thiagarajan Raman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 874 days.

(21) Appl. No.: 17/884,475

(22) Filed: Aug. 9, 2022

(65) Prior Publication Data

US 2024/0055400 A1 Feb. 15, 2024

(51) Int. Cl.
H01L 25/065 (2023.01)
H01L 25/00 (2006.01)

(52) U.S. Cl.
CPC .......... H01L 25/0657 (2013.01); H01L 25/50 (2013.01); *H01L 2225/0651* (2013.01); *H01L 2225/06517* (2013.01); *H01L 2225/06548* (2013.01); *H01L 2225/06582* (2013.01)

(58) Field of Classification Search
CPC ................. H01L 25/0657; H01L 25/50; H01L 2225/0651; H01L 2225/06517; H01L 2225/06548; H01L 2225/06582; H01L 25/105; H01L 2225/06572; H01L 2225/1064

USPC .......................................................... 257/777
See application file for complete search history.

(56) References Cited

U.S. PATENT DOCUMENTS

| | | | | |
|---|---|---|---|---|
| 6,175,160 B1 * | 1/2001 | Paniccia | ............. | H01L 25/0657 257/781 |
| 8,004,080 B2 * | 8/2011 | McShane | ............ | H01L 25/0657 257/E23.101 |
| 8,692,388 B2 * | 4/2014 | Lee | .......................... | H01L 25/50 257/777 |
| 2003/0183943 A1 * | 10/2003 | Swan | ................ | H01L 21/76898 257/E21.705 |
| 2004/0164390 A1 * | 8/2004 | Wang | .................. | H01L 23/4334 257/E23.092 |
| 2005/0136635 A1 * | 6/2005 | Savastiouk | ......... | H01L 23/5384 257/E23.172 |
| 2009/0160065 A1 * | 6/2009 | Haba | .................... | H01L 25/0657 438/109 |

(Continued)

*Primary Examiner* — Caleb E Henry
*Assistant Examiner* — Pratiksha Jayant Lohakare
(74) *Attorney, Agent, or Firm* — Dorsey & Whitney LLP

(57) ABSTRACT

This document discloses techniques, apparatuses, and systems for providing a semiconductor device assembly with a substrate for vertically assembled semiconductor dies. A semiconductor assembly is described that includes a semiconductor die coupled to a substrate such that an active surface of the semiconductor die is substantially orthogonal to a top surface of the substrate. The substrate includes a surface having a recessed slot at which a side surface of the semiconductor die couples. The semiconductor die includes a contact pad that couples to a contact pad at the recessed slot. In doing so, the techniques, apparatuses, and systems herein enable a robust and cost-efficient semiconductor device to be assembled.

20 Claims, 12 Drawing Sheets

(56)        References Cited

U.S. PATENT DOCUMENTS

| | | | |
|---|---|---|---|
| 2010/0096761 A1* | 4/2010 | Jiang ..................... | H01L 23/544 |
| | | | 257/777 |
| 2011/0210444 A1* | 9/2011 | Jeng ........................ | H01L 24/97 |
| | | | 257/E23.173 |
| 2013/0127070 A1* | 5/2013 | Jung ................. | H01L 23/49811 |
| | | | 257/777 |
| 2017/0148763 A1* | 5/2017 | Woychik ............. | H01L 21/4803 |

* cited by examiner

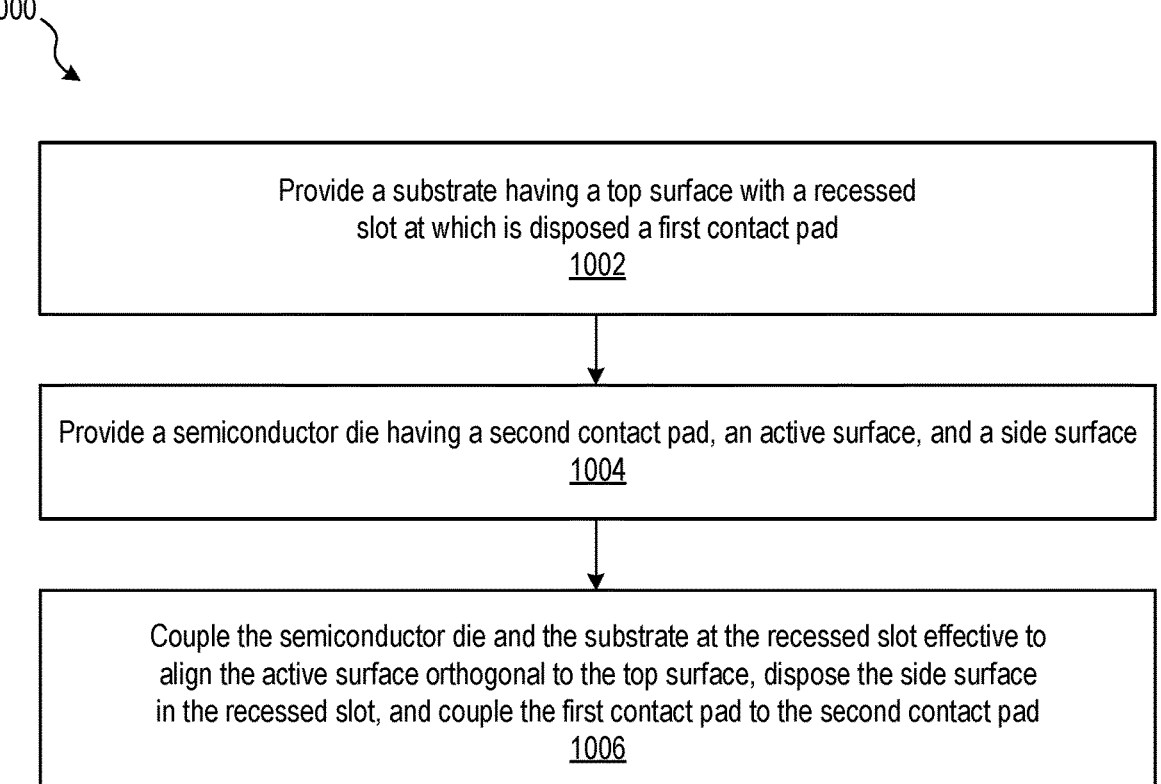

Provide a substrate having a top surface with a recessed
slot at which is disposed a first contact pad
1002

Provide a semiconductor die having a second contact pad, an active surface, and a side surface
1004

Couple the semiconductor die and the substrate at the recessed slot effective to
align the active surface orthogonal to the top surface, dispose the side surface
in the recessed slot, and couple the first contact pad to the second contact pad
1006

*FIG. 10*

SUBSTRATE FOR VERTICALLY ASSEMBLED SEMICONDUCTOR DIES

TECHNICAL FIELD

The present disclosure generally relates to semiconductor device assemblies, and more particularly relates to a substrate for vertically assembled semiconductor dies.

BACKGROUND

Microelectronic devices generally have a die (i.e., a chip) that includes integrated circuitry with a high density of very small components. Typically, dies include an array of very small bond pads electrically coupled to the integrated circuitry. The bond pads are external electrical contacts through which the supply voltage, signals, etc., are transmitted to and from the integrated circuitry. After dies are formed, they are "packaged" to couple the bond pads to a larger array of electrical terminals that can be more easily coupled to the various power supply lines, signal lines, and ground lines. Conventional processes for packaging dies include electrically coupling the bond pads on the dies to an array of leads, ball pads, or other types of electrical terminals, and encapsulating the dies to protect them from environmental factors (e.g., moisture, particulates, static electricity, and physical impact).

BRIEF DESCRIPTION OF THE DRAWINGS

FIG. 10 illustrates an example method for fabricating a semiconductor device assembly in accordance with an embodiment of the present technology.

DETAILED DESCRIPTION

Semiconductor devices are integrated in many devices to implement memory cells, processor circuits, imager devices, and other functional features. As more applications for semiconductor devices are discovered, designers are tasked with creating improved devices that can perform a greater number of operations per second, store greater amounts of data, or operate with a higher level of security. To accomplish this task, designers continue to develop new techniques to increase the number of circuit elements on a semiconductor device without simultaneously increasing the size of the device. This development, however, may not be sustainable due to various challenges that arise from designing semiconductor device with high circuit density. Thus, additional techniques may be required to continue the growth in capability of semiconductor devices.

One such technique is to implement multiple semiconductor dies within a single package. These multiple dies may be stacked to increase the number of circuit elements within the package without increasing a footprint (e.g., horizontal area) of the device. Stacked semiconductor devices (e.g., three-dimensional interface (3DI) packaging solutions) are often implemented as a set of multiple semiconductor dies disposed on a semiconductor wafer. The semiconductor wafers may be thinned (e.g., to less than 100 micrometers (μm)) to reduce the vertical thickness of the stacked semiconductor devices and satisfy the spatial constraints of the electronic device in which they are implemented, for example, based on the thickness of the electronic device. These dies are then physically and electronically connected to one another to secure and communicatively couple the stacked dies. Many solutions for connecting the dies, however, may be difficult or costly to implement. One such semiconductor assembly is illustrated by way of example in FIG. 1.

Figure 1:
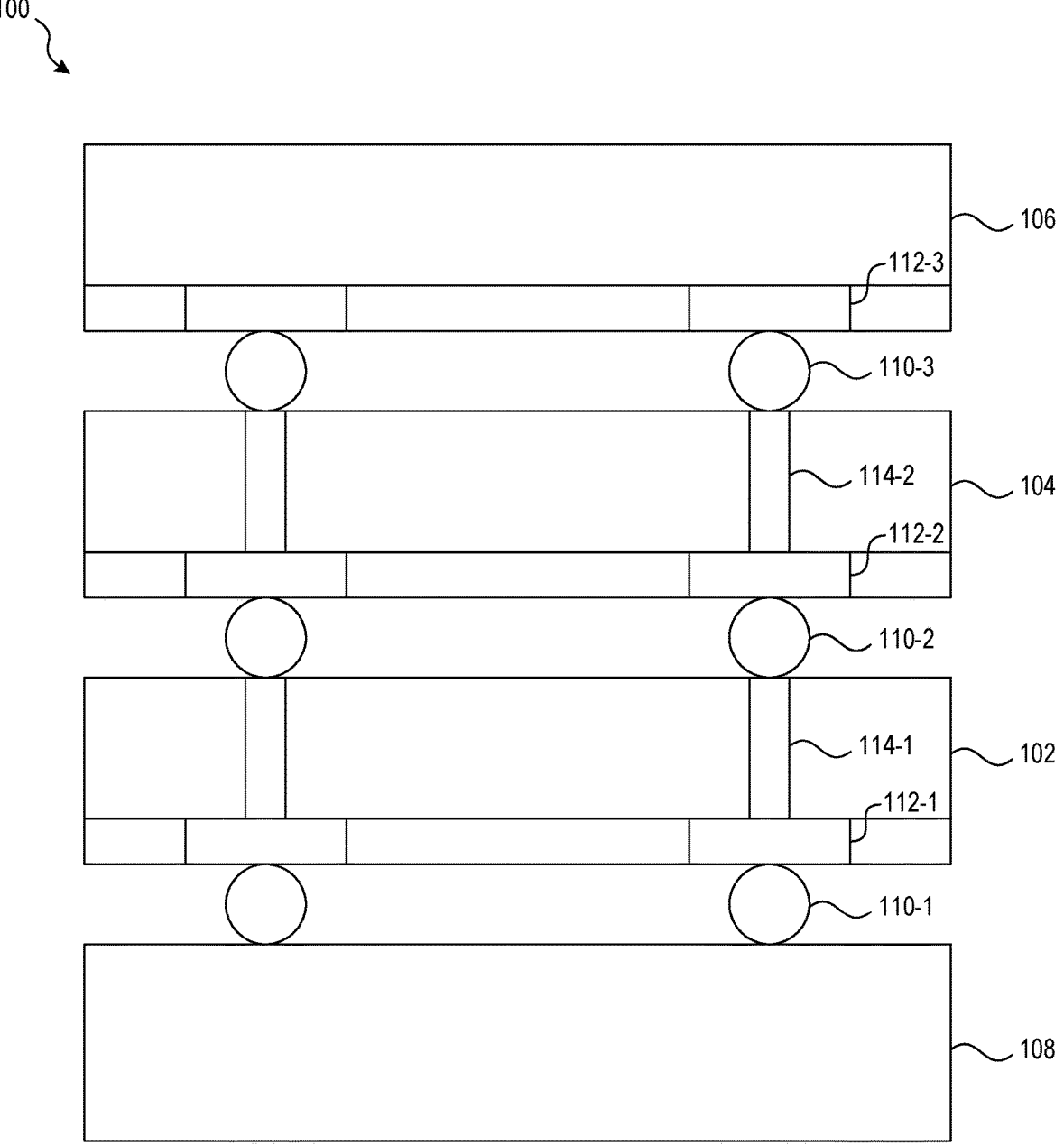
FIG. 1 illustrates a simplified schematic cross-sectional view of an example semiconductor device assembly.

As can be seen with reference to FIG. 1, a semiconductor device assembly 100 includes multiple stacked semiconductor dies. The semiconductor die 102 is used to mount a semiconductor die 104, which is used to mount a semiconductor die 106. The stacked semiconductor dies are assembled on a substrate 108. The dies may couple to one another or the substrate 108 through solder joints 110 (e.g., solder joint 110-1, 110-2, and 110-3), which couple to contact pads 110 (e.g., contact pad 112-1, 112-2, and 112-3) on the dies and the substrate 108. Through-silicon vias (TSVs 114) (e.g., TSV 114-1, 114-2, and 114-3) are implemented within the die 102 and the die 104 to connect the contact pads 112 and electrically couple the dies.

To implement the TSVs 114, copper may be deposited within a channel of the substrate used to manufacture the die. After the copper has been deposited, circuitry may be deposited at the active surface of the substrate to provide functionality to the die. An inactive side of the die may then be thinned to reveal the TSVs 114. In general, this thinning process may be stressful on the die, particularly in application where the dies are implemented on thin substrates, for instance, in stacked semiconductor device assemblies. This stress caused by the thinning process may cause irreparable damage to the die, which in some cases may require the die to be remanufactured, thereby causing bottlenecks in the design process and wasting manufacturing resources. Thus, assembly designs that require multiple dies to implement TSVs may risk design failures and be costly to manufacture.

To address these drawbacks and others, various embodiments of the present application provide semiconductor device assemblies that include a substrate for vertically assembled dies. The substrate may include recessed slots configured to couple to vertically assembled dies (e.g., such that an active surface of the dies is substantially orthogonal to a top surface of the substrate). The recessed slots may include contact pads that electrically couple to contact pads located on the dies when the dies are vertically assembled at the recessed slots. In doing so, each die may directly couple to the substrate, and a robust and efficient semiconductor device may be assembled.

The technology disclosed herein relates to semiconductor devices, systems with semiconductor devices, and related methods for manufacturing semiconductor devices. The term "semiconductor device" generally refers to a solid-state device that includes one or more semiconductor materials. Examples of semiconductor devices include logic devices, memory devices, and diodes, among others. Furthermore, the term "semiconductor device" can refer to a finished device or to an assembly or other structure at various stages of processing before becoming a finished device. Depending upon the context in which it is used, the term "substrate" can refer to a structure that supports electronic components (e.g., a die), such as a printed circuit board (PCB) or wafer-level substrate, a die-level substrate, or another die for die-stacking or 3DI applications.

A person having ordinary skill in the relevant art will recognize that suitable steps of the methods described herein can be performed at the wafer level or at the die level. Thus, although some examples may be illustrated or described with respect to dies or wafer, the technology disclosed herein may apply to dies or wafers. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, the terms "vertical," "lateral," "upper" and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down and left/right can be interchanged depending on the orientation.

Figure 2:
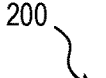
FIG. 2 illustrates a simplified schematic cross-sectional view of a semiconductor device assembly in accordance with an embodiment of the present technology.

FIG. 2 is a simplified schematic cross-sectional view of a semiconductor device assembly 200 in accordance with embodiments of the present technology. The semiconductor device assembly 200 includes semiconductor dies 202 (e.g., die 202-1, 202-2, 202-3, and die 202-4) assembled vertically onto a substrate 204. The dies 202 may include contact pads 206 (e.g., conductive pads) that couple directly or indirectly to internal or external traces, vias, lines, and other electrical connection structures to provide functionality to the dies 202 (e.g., power, ground, input/output (I/O) signals). The substrate 204 may similarly include contact pads 208 that may couple to the contacts pads 206 of the dies 206 or to external connections, for instance, located on a printed circuit board (PCB). The substrate 204 includes recessed slots configured to couple to the vertically assembled dies 202 (e.g., an active surface of the dies is substantially orthogonal to the top surface of the substrate). The contact pads 206 may couple to the contact pads 208 through solder joints 210 based on the vertical assembly of the dies 202 in the recessed slots.

In contrast to the stacked semiconductor device assembly shown in FIG. 1, the substrate 204 is configured to couple to the dies 202 such that the dies are assembled vertically on the substrate 204 with the active side of the die (e.g., where circuitry is implemented) facing laterally. An sidewall of the dies 202 may be supported by a lower surface of the recessed slots, while a side surface of the recessed slots may support an inactive side (e.g., opposite the active side) of the dies 202. The contact pads 206 and the contact pads 208 may be implemented at various locations around the recessed slots to enable the pads to be connected through various connective structures (e.g., the solder joints 210).

The contact pads 208 may couple the dies to one or more connected resources. For example, the contact pads 208 may internally connect to one another through internal circuitry in the substrate 204. Alternatively or additionally, the contact pads 208 may connect to one or more external connective structures that provide external connectivity to the substrate and the coupled dies. In some cases, the substrate 204 may be assembled onto another substrate, for example, a silicon interposer or printed circuit board (PCB) that may couple the dies 202 to one another or to other components on the PCB. In other instances, all or portions of the system-level connective circuitry may be implemented within the substrate 204 without requiring a separate interposer.

The substrate 204 may include various connective structures to couple the dies 202 to external connections. For example, the substrate 204 can include through-silicon vias (TSVs) (not shown) that connect circuitry (e.g., the contact pads 208) on the upper portion of the substrate 204 to circuitry (e.g., external connections) at the lower portion of the substrate 204. The TSVs may be implemented as conductive structures (e.g., interconnects) that pass through the substrate thereon. In this way, the dies coupled to the contact pads 208 may directly communicate with circuitry coupled to the lower surface of the substrate 204 at the exposed TSVs without electrically routing through circuitry in the substrate 204.

Each of the dies 202 may couple directly to the substrate 204 without passing through an intermediate die. As a result, TSVs can be implemented at the substrate 204 and need not be implemented at the dies 202, thereby limiting the fragile TSV manufacture and exposure process to the substrate 204. This may prevent irreparable harm to the dies 202 that may result from back grinding the wafers to expose the TSVs after circuitry has been constructed at the active side of the die. Thus, the technology herein may provide a robust and cost-efficient semiconductor device to be assembled.

Figure 3:
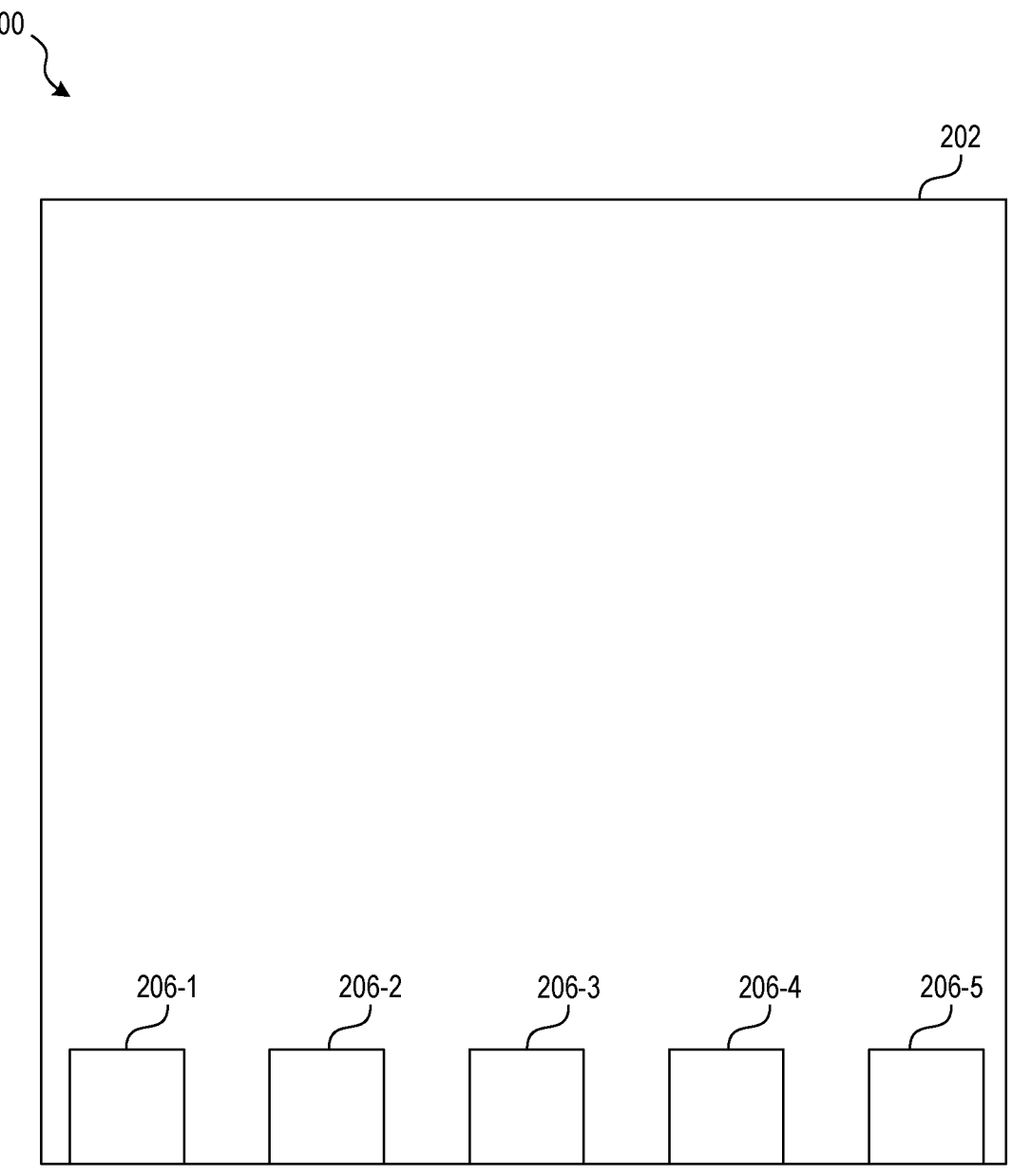
FIG. 3 illustrates a simplified schematic partial plan view of a semiconductor device assembly in accordance with an embodiment of the present technology.

FIG. 3 illustrates a simplified schematic plan view of a semiconductor device assembly 300 in accordance with embodiments of the present technology. FIG. 3 may correspond to a top-down view of the active side of one of the semiconductor dies 202. The die 202 may include one or more contact pads 206 (e.g., contact pad 206-1, 206-2, 206-3, 206-4, and 206-5).

Although not illustrated in FIG. 3, the active side of the die 202 (e.g., the surface shown in FIG. 3) may include circuitry that routes to or from the contact pads 206. The contact pads 206 may be implemented at or near the edge of die 202. The contact pads 206 may be spaced from one another, as illustrated, to prevent interferences across the various pads. In general, the contact pads 206 may correspond to contact pads at the substrate to which the die 202 connects (e.g., contact pads 208 of FIG. 2). For example, the contact pads 206 may be designed such that they may couple to the contact pads at the substrate when they are assembled vertically at a recessed slot of the substrate.

Figure 4:
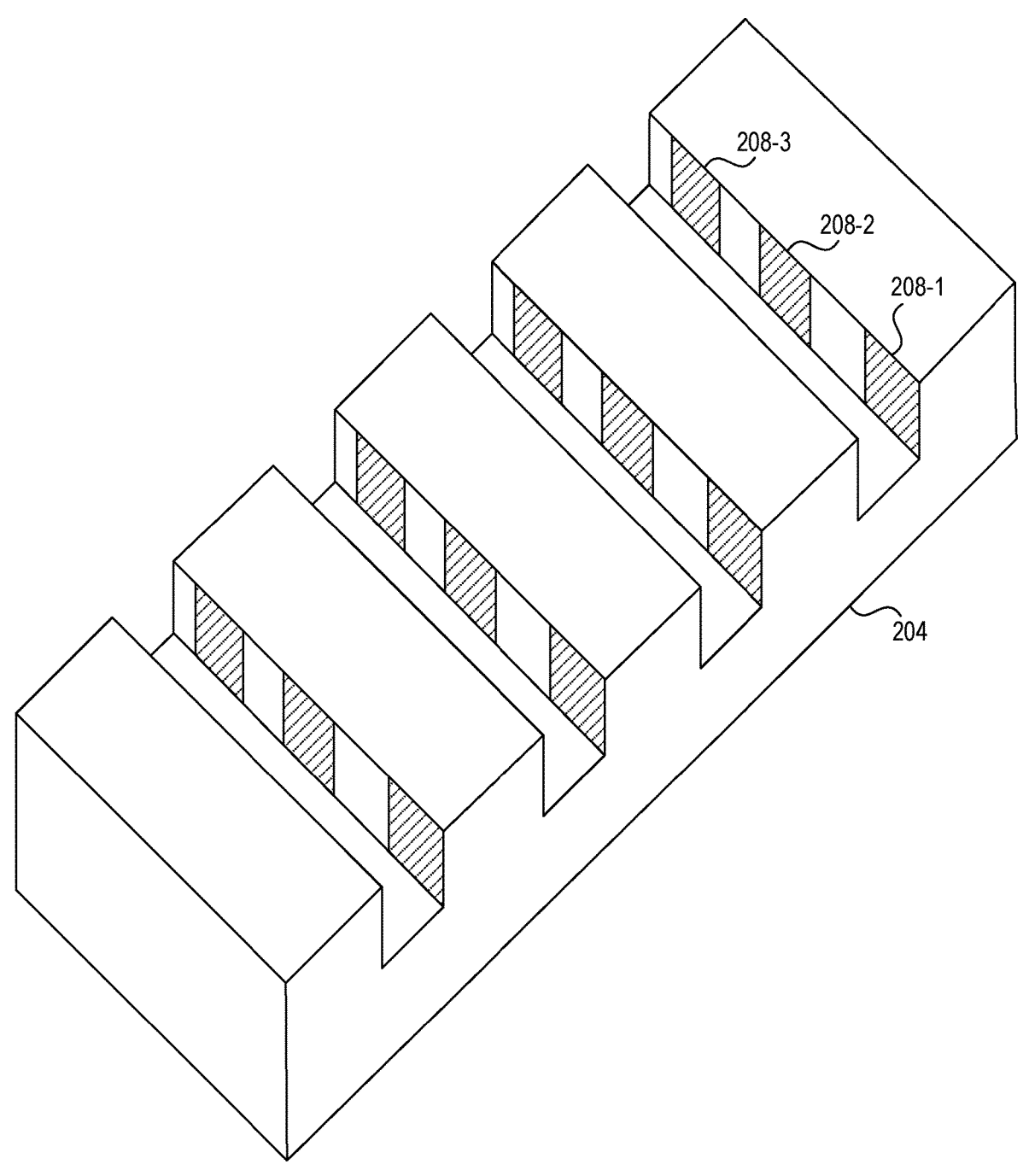
FIG. 4 illustrates a simplified schematic perspective view of a semiconductor device assembly in accordance with an embodiment of the present technology.

FIG. 4 illustrates a simplified schematic perspective view of a semiconductor device assembly 400 in accordance with embodiments of the present technology. FIG. 4 may correspond to a perspective view of the substrate 204 without the dies vertically assembled at the recessed slots.

The substrate 204 is shown with multiple recessed slots. Each of the slots may be of similar or different size to any of the other slots. A side surface of the slots may be implemented with one or more contact pads 208, which couple to contact pads on the dies (e.g., contact pads 206 of FIG. 2) to electrically couple the substrate 204 and the dies. Multiple contact pads 208 may be implemented at or near the slots to enable a larger number of connections between the dies and the substrate. The contact pads 208 may be laterally spaced along the slot to prevent interference across the various contact pads 208. The contact pads 208 may correspond to contact pads on the dies to enable the pads to easily couple to one another (e.g., through a connective structure) when the dies are assembled vertically at the slots.

Although illustrated at a particular location of the substrate 204, the contact pads 208 may be located at other locations at or around the slots. For example, the contact pads 208 may be located at an additional side surface of the slots, at a bottom surface of the slots, or at a top surface of the substrate 204 adjacent to the slots. Moreover, the contact pads 208 may not span the entire surface at which they are located. For example, although illustrated as having the same thickness as the side surface of the slot, the contact pads 208 may span only a portion of the vertical thickness of the slot.

Figure 5A:
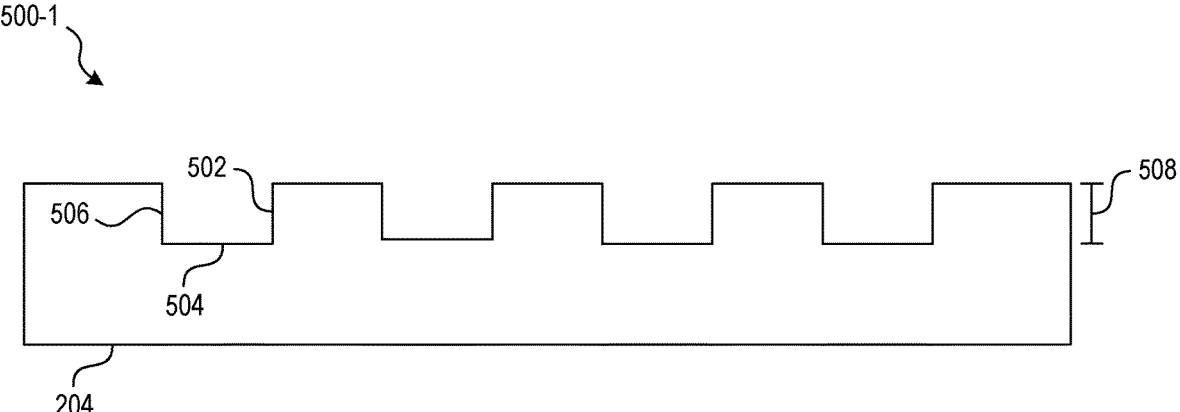
FIGS. 5A-7C illustrate simplified schematic cross-sectional views of a series of fabrication steps of semiconductor device assemblies in accordance with an embodiment of the present technology.

FIGS. 5A through 7C illustrate simplified schematic cross-sectional views of a semiconductor device assembly at selected stages in a manufacturing method in accordance with an embodiment of the present technology. As illustrated in FIGS. 5A and 5B, the method can include a stage 500 for providing the substrate 204. The substrate may be provided in accordance with any number of techniques, two of which are described with respect to FIGS. 5A and 5B.

FIG. 5A illustrates a stage 500-1 for providing the substrate 204 by etching slots into the substrate 204. For example, a substrate 204 may be provided having a rectangular cross-section. The slots may be etched into the top surface of the substrate to create locations at which the dies may be vertically assembled onto the substrate 204. As shown, the slots have a rectangular cross section, with a side surface 502, a bottom surface 504, and a side surface 506. However, it should be appreciated that the substrate 204 can be etched to create the slots with any other shape or configuration that supports the vertical assembly of semiconductor dies.

The slots may be etched to a particular depth 508. The depth 508 may be designed such that the slots are sufficient to support the vertical assembly of the dies onto the substrate. The depth 508 may also be determined such that there is adequate space to provide contact pads at or around the slots that may couple to contact pads on the dies. The slots may be etched through any appropriate technique, for example, using plasma etching or wet etching. In some instances, the photolithography may be used to etch the slots into the substrate 204

Figure 5B:
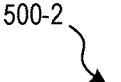
Figure 5B:
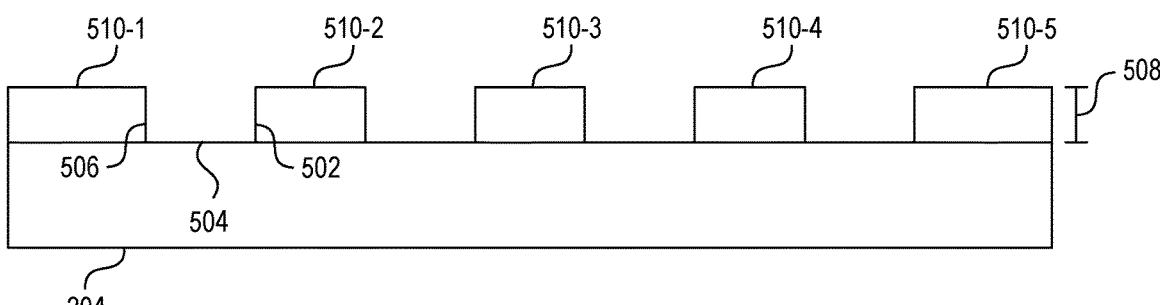

FIG. 5B illustrates a stage 500-2 for providing the substrate 204 by depositing material 510 (e.g., material 510-1, 510-2, 510-3, 510-4, and 510-5) at the surface of the substrate 204. The material 510 may include, for example, a passivized material, such as silicon oxide ($SiO_2$), silicon nitride (SiN), silicon carbide (SiC), silicon carbon nitride (SiCN), or the like. The material 510 may deposited on the surface of the substrate 204 using, for example, chemical vapor deposition, physical vapor deposition, atomic layer deposition, spin coating, and/or other suitable techniques. In some implementations, the material 510 may be selectively deposited at particular locations along the surface of the substrate 204. In these or other implementations, the material 510 may be deposited on the surface in a continuous layer and etched to create the slots. The material 510 may be etched in a similar manner to the substrate described in FIG. 5A.

Initially, the substrate 204 may be provided with a rectangular cross-section, and material 510 may be deposited at an upper surface of the substrate 204 to create the recessed slots. Similar to FIG. 5B, the slots may be created with a rectangular cross-section having side surface 502, bottom surface 504 substantially parallel (e.g., within about 1 degree, within about 3 degree, within about 5 degree, or within about 10 degree) the side surface 502, and side surface 506 substantially parallel and opposite the side surface 506. The material may be deposited with a particular thickness to create slots with depth 508. For example, the material 510 may be deposited with the same thickness as the depth 508. Alternatively, the material 510 may be deposited with a greater thickness than the depth 508 and planarized down to create slots with depth 508. The material 510 may be planarized through any number of appropriate techniques, for example, using chemical planarization, mechanical planarization, or any combination of both.

In some implementations, depositing material 510 on the substrate 204 to create the slots instead of etching the substrate 204 to create the slots may enable circuitry to be disposed at the surface of the substrate 204 beneath the slots. This circuitry may be used to create internal connections between the various contact pads on the substrate 204 (e.g., contact pads 208 of FIG. 2). In doing so, the substrate 204 may enable internal connectivity between the dies without routing through circuitry external to the substrate 204. In some implementations, the circuitry may be disposed on the upper surface of the substrate 204 prior to depositing the material 510.

Although discussed as alternative implementations to create the slots, the techniques discussed in FIGS. 5A and 5B may be performed in combination with one another to create the recessed slots. For example, material 510 may be deposited at the substrate 204 and the substrate 204 may be etched to create the slots. Thus, it should be appreciated that these techniques may be performed individually or in combination with any other appropriate technique to create the slots.

Figure 6:

As illustrated in FIG. 6, the method can include a stage 600 for assembling the dies 202 onto the substrate 204 at the recessed slots. The dies 202 may be assembled vertically onto the substrate such that the active surface of the dies 202 faces laterally. For example, the dies 202 may be assembled onto the substrate 204 such that the side surface of the dies 202 that is substantially orthogonal (e.g., between about 89 and 91 degrees, between about 87 and 93 degrees, between about 85 and 95 degrees, or between about 80 and 100 degrees) to the active surface mates with a bottom surface of the slots. Moreover, the inactive surface of the dies 202 opposite the active surface may mate with a side surface of the slots. In other implementations, the dies 202 may not be supported by the side surface of the slots but instead be positioned in the middle of the slots equidistant from each of the side surfaces.

The dies 202 may include contact pads 206 that couple to the contact pads 208 of the substrate 204. In some implementations, the contact pads 206 may be implemented at an edge of the active surface of the dies 202. Alternatively or additionally, the contact pads 206 may be implemented at an side surface of the dies 202. Given that the substrate 204 may be composed of a doped semiconductor material, the substrate 204 may possess slight conductivity. Thus, any portion of the substrate 204 that is likely to contact the contact pads 206 (e.g., the bottom surface of the slots) may be passivized to prevent leakage onto the substrate 204. The surface may be passivized through any number of techniques, including passivation, oxidation, chemical vapor deposition, physical vapor deposition, atomic layer deposition, spin coating, and/or other suitable techniques. Additionally or alternatively, the contact pads 206 may be implemented a small distance from the edge of the dies 202 to prevent contact with the substrate 204.

The substrate 204 may similarly include contact pads 208 that couple to the contact pads 206 located on the dies 202. Although shown in a particular location, the contact pads 208 may be located at any other location at or adjacent to the slots. Although shown as spanning a depth of the slots, the contact pads 208 may instead span only a portion of the slots as long as adequate connection may still be made between the contact pads 206 and the contact pads 208 through a connective structure (e.g., a solder joint).

Figure 7A:
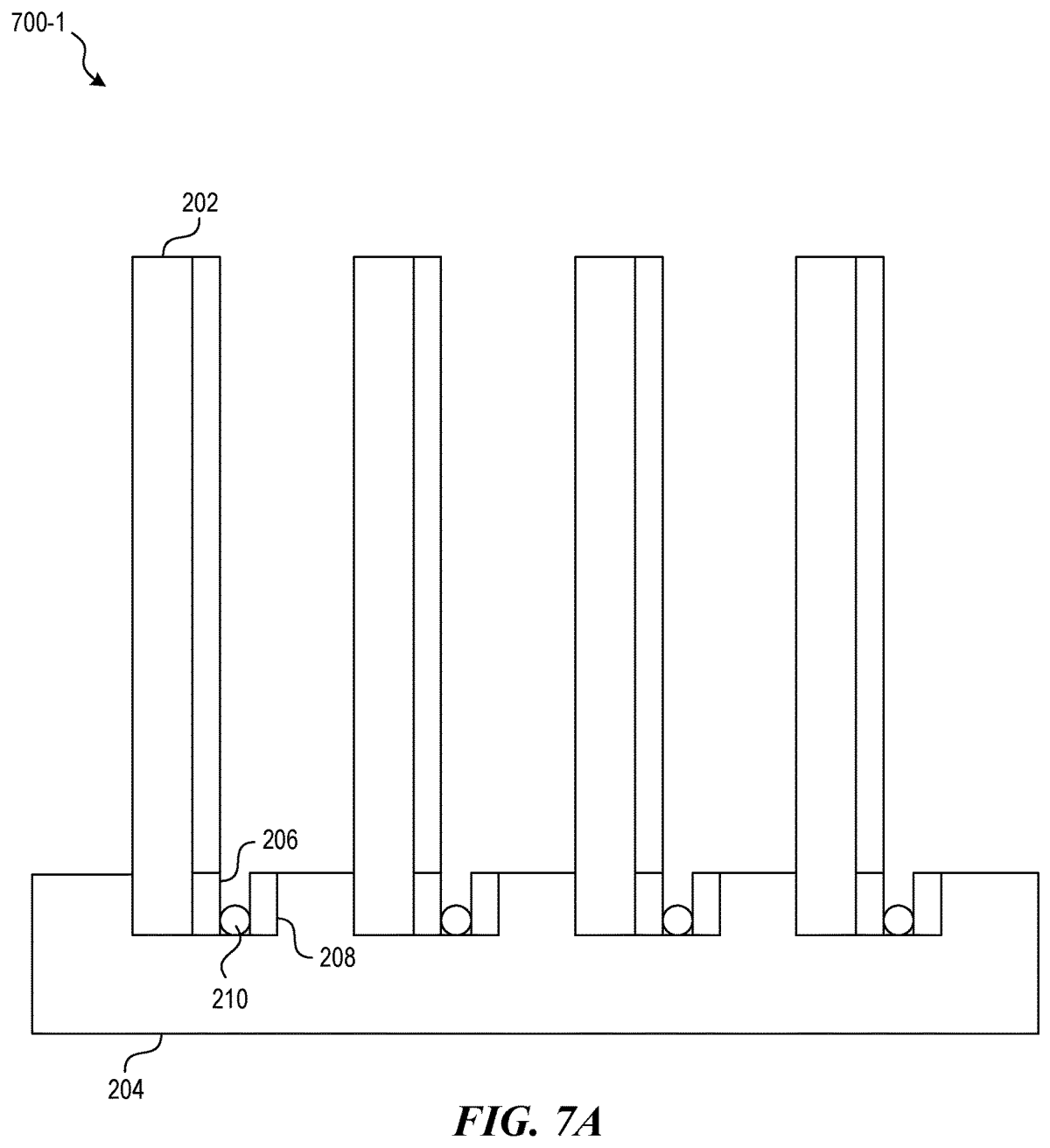
Figure 7B:
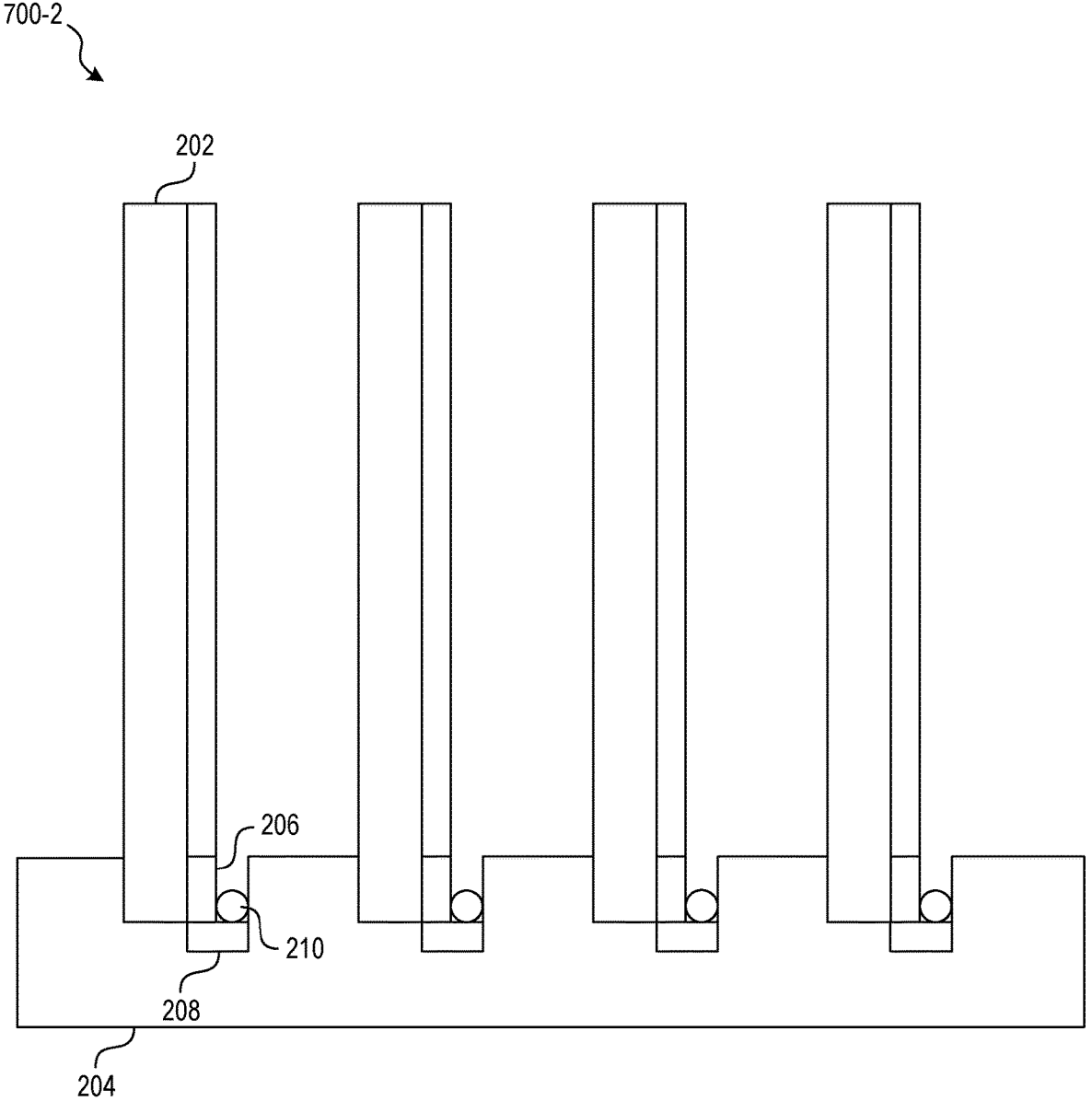
Figure 7C:
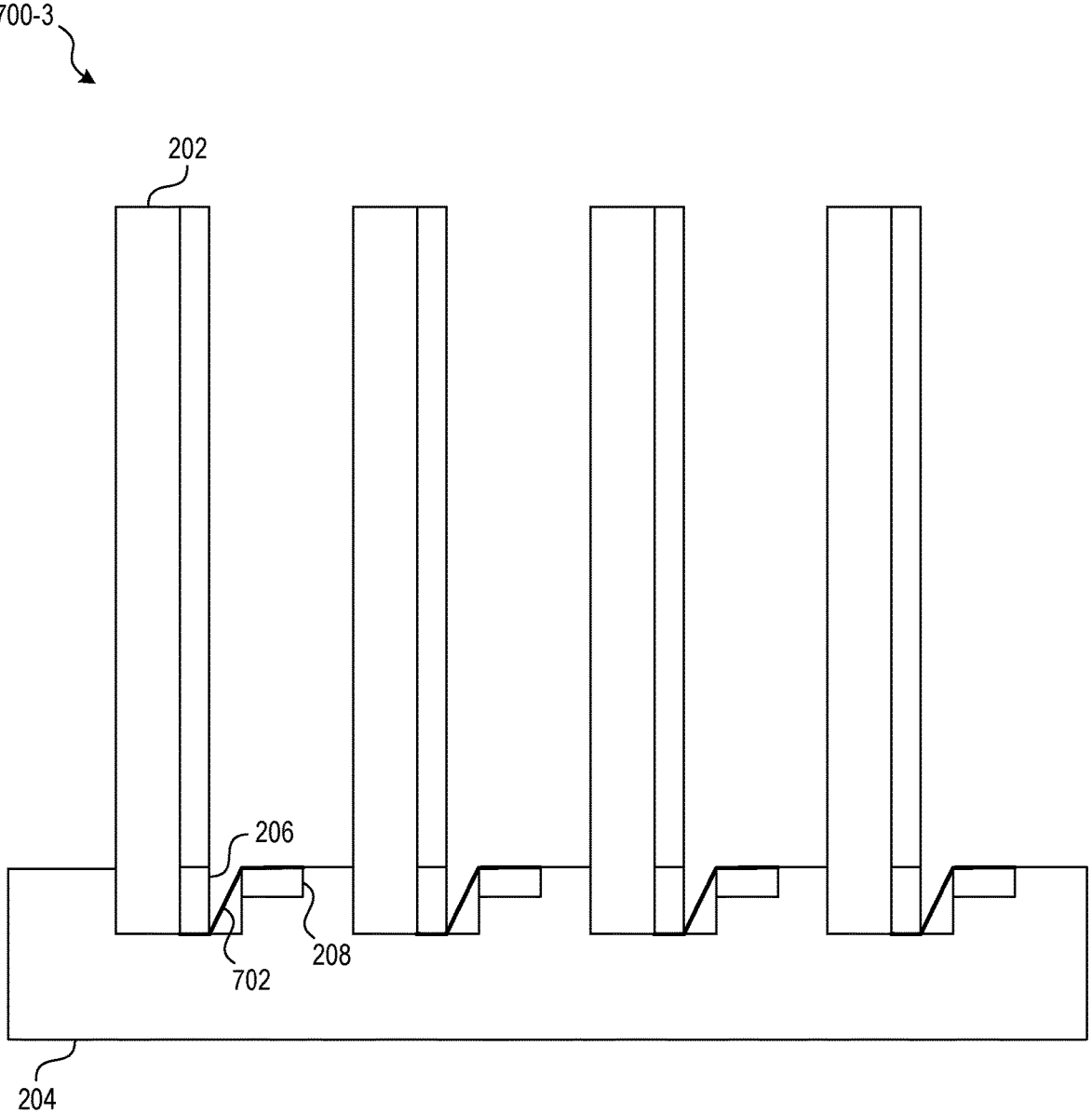

As illustrated in FIGS. 7A-7C, the method can include a stage 700 for coupling the dies 202 to the substrate 204. Various implementations for coupling the dies 202 and the substrate 204 are shown in FIGS. 7A-7C. It should be appreciated, however, that these are but some of the possible implementations for coupling the dies 202 and the substrate 204, and other implementations are possible and considered, including those that combine elements (e.g., contact pad locations, connective structures, etc.) of one or more of the implementations illustrated in FIGS. 7A-7C.

FIG. 7A illustrates a stage 700-1 for coupling the dies 202 to the substrate 204 through a solder joint 210. In the illustrated stage 700-1, contact pads 206 are located on the dies 202 and corresponding to contact pads 208 implemented at the side surface of the recessed slots. The dies 202 are assembled vertically at recessed slots of the substrate 204 such that contact pads 206 may couple to contact pads 208 through a connective structure.

As illustrated, the contact pads couple through a solder joint 210 created from solder material that has been placed between the dies 202 and the substrate 204 and then heated. This heating process (e.g., reflow) may cause the solder material to transform into a molten state and then cool to become the solder joint 210 coupling the contact pads 206 and the contact pads 208. The solder joint 210 may be a conductive coupling (e.g., composed of tin, gold, aluminum, or an alloy of these materials) that can carry electrical signaling between the dies 202 and the substrate 204. Thus, the coupled semiconductor device assembly may have connectivity between the dies 202 or to external connections.

FIG. 7B illustrates a stage 700-2 for coupling the dies 202 to the substrate 204 through solder joints 210. The dies 202 are assembled vertically at recessed slots of the substrate 204 such that contact pads 206 may couple to contact pads 208 through a connective structure.

As illustrated, the contact pads couple through the solder joints 210, which may be created similarly to the process described with respect to FIG. 7A. In contrast to FIG. 7A, however, the contact pads 208 are implemented at a bottom surface of the recessed slots instead of at the side surface. In some cases, implementing the contact pads 208 at the bottom surface may provide a number of advantages. For example, the bottom surface contact pads 208 may provide a better connection surface for the solder joints 210. Moreover, the bottom surface contact pads 208 may be easier to connect to internal circuitry that may provide die-die connectivity through internal routing circuitry in the substrate 204 (e.g., as described with respect to FIG. 5B). As another possible advantage, the bottom surface contact pads may be more easily connected to one or more external connection structures, for example, TSVs that extend through the substrate and couple to one or more external connections.

FIG. 7C illustrates a stage 700-3 for coupling the dies 202 to the substrate 204 through conductive film 702. In the illustrated stage 700-3, contact pads 206 are located on the dies 202 and corresponding to contact pads 208 implemented at the top surface of the substrate 204 adjacent to the recessed slots. The dies 202 are assembled vertically at recessed slots of the substrate 204 such that contact pads 206 may couple to contact pads 208 through a connective structure.

As illustrated, the dies 202 electrically couple to the substrate through the conductive film 702. The conductive film 702 may be composed of any conductive material, for example, copper, gold, silver, aluminum, or any alloy produced from these materials. The conductive film 702 may be pliable such that the shape of the film may conform to the shape required to couple the contact pads 206 to the contact pads 208. The conductive film 702 may be placed within the recessed slot prior to assembling the dies 202 at the substrate. In this way, the conductive film 702 may conform when the dies 202 are assembled on the substrate to effectively couple the dies 202 and the substrate 204. The conductive film 702 may be coupled to the contact pads 206 or the contact pads 208 through one or more intermediate material, for example, solder paste or adhesive, to ensure that coupling remains intact.

In contrast to FIGS. 7A and 7B, the contact pads 208 are not implemented within the recessed slots but adjacent to them at the upper surface of the substrate 204. In some implementations, implementing the contact pads 208 at this location may enable the contact pads 208 to be connected to circuitry disposed along the top surface of the substrate 204. Moreover, TSVs may more easily connect to contact pads 208 located on the upper surface of the substrate 204. In general, however, any number of techniques may be used to electrically couple the contact pads 206 to the contact pads 208 in any number of configurations.

In addition to electrically coupling the dies 202 to the substrate 204, the stage for coupling the dies 202 to the substrate 204 may include mechanical coupling to structurally support the assembly. For example, adhesive may be applied between the dies 202 and the substrate 204 at the bottom surface or the side surface of the recessed slots to support the mechanical coupling of the dies 202 and the substrate 204. Alternatively or additionally, the coupling surface of the dies 202 or the substrate 204 may be passivized to enable direct bonding between the surfaces. In doing so, the dies 202 and the substrate 204 may be mechanically coupled beyond the mechanical coupling supported by the connective structure coupling the contact pads 206 to the contact pads 208 (e.g., solder joints 210 or conductive film 702).

Figure 8:
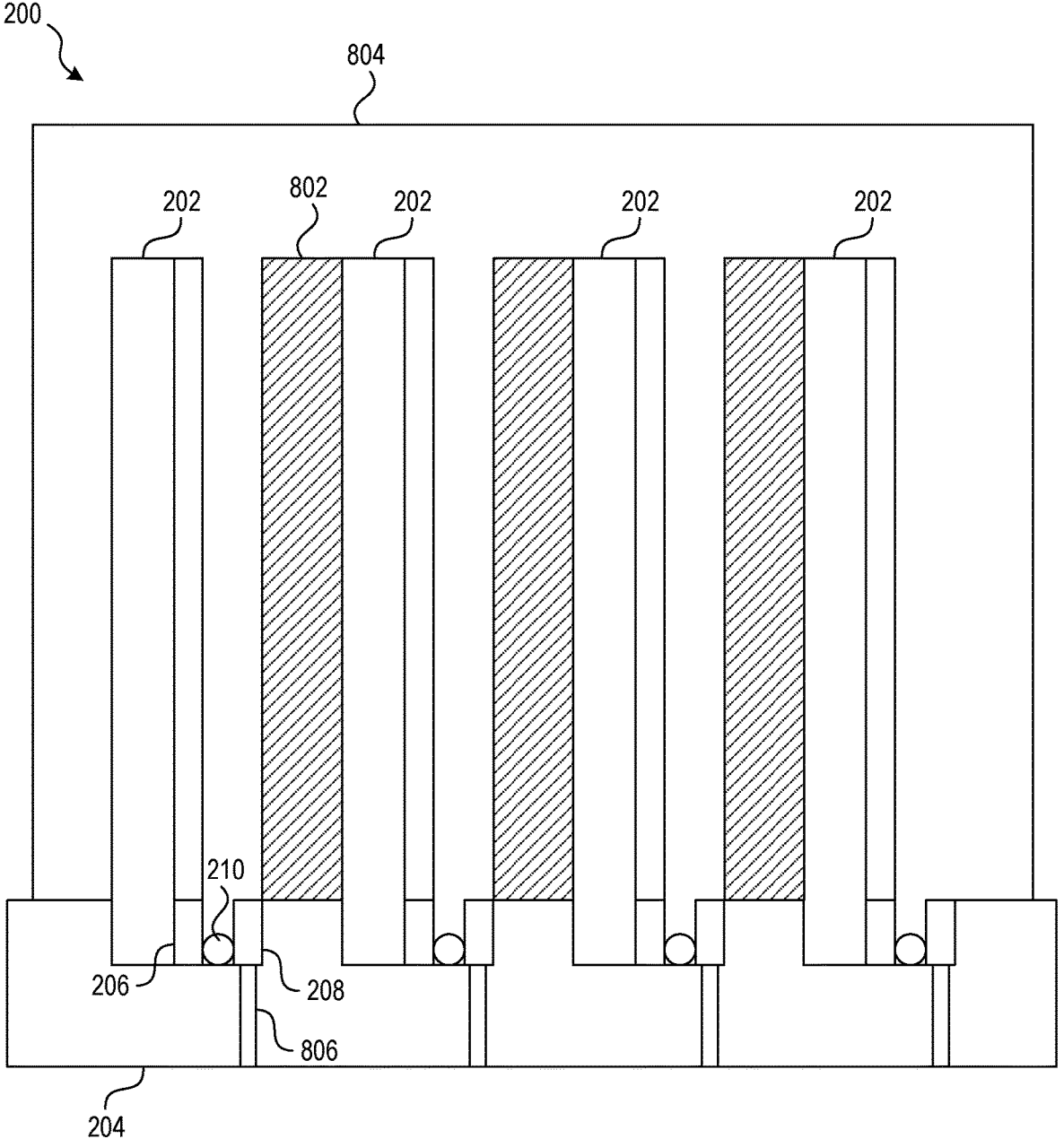
FIG. 8 illustrates a simplified schematic cross-sectional view of a semiconductor device assembly in accordance with an embodiment of the present technology.

FIG. 8 illustrates a simplified schematic cross-sectional view of a semiconductor device assembly 800 in accordance with an embodiment of the present technology. The dies 202 are vertically assembled on the substrate 204 at the recessed slots such that the contact pads 206 couple to the contact pads 208 through the solder joints 210. The vertical assembly of the dies 202 may be supported by one or more materials. For example, the structures 802 may extend from the substrate and support or insulate the dies 202. The structures 802 may be deposited on the substrate 204 before, during, or after the assembly of the dies 202 on the substrate 204. In aspects, the structures 802 may be composed of any number of materials, for example, a polymer material, a dielectric material, or any other suitable material. In some implementations, the structures 802 may be replaced or supplemented with an underfill that supports or insulates the dies 202.

Once assembled, the dies 202 may be packaged into a semiconductor device that may be implemented within any number of suitable electronic devices. The semiconductor device assembly 800 includes an encapsulant 804 (e.g., housing) that at least partially encapsulates the dies 202. The encapsulant 804 may act as a protecting covering for the dies 202 to prevent damage from contact, radiation, moisture, and so on. The encapsulant 804 may enclose one or more sets of semiconductor dies assembled in multiple semiconductor device assemblies or a single semiconductor device assembly.

After packaging the dies 202, the substrate 204 may be assembled onto a substrate that provides external connectivity to the semiconductor device. As illustrated, the substrate 204 includes TSVs 806 that couple to the contact pads 208 and extend through the lower surface of the substrate 204. In doing so, the dies 202 may be connected to one or more external connections at the lower surface. For example, the substrate 204 may be assembled onto a PCB that provides routing between various components assembled thereon. In some implementations, the substrate 204 may include circuitry at the lower surface, and the TSVs 806 may couple the contact pads 208 to the circuitry on the lower surface. As a result, the semiconductor device may provide various functionality to an electronic device in which it is implemented Although the foregoing example semiconductor device assemblies have been illustrated and described as including a particular number of semiconductor dies, in other embodiments, assemblies can be provided with more or less semiconductor dies. For example, the semiconductor devices illustrated in FIGS. 2 through 8 could be replaced with semiconductor devices having any other number of semiconductor dies, mutatis mutandis.

In accordance with one aspect of the present disclosure, the semiconductor devices illustrated in the assemblies of FIGS. 2-8 could be memory dies, such as dynamic random-access memory (DRAM) dies, NOT-AND (NAND) memory dies, NOT-OR (NOR) memory dies, magnetic random-access memory (MRAM) dies, phase change memory (PCM) dies, ferroelectric random-access memory (FeRAM) dies, static random-access memory (SRAM) dies, or the like. In an embodiment in which multiple dies are provided in a single assembly, the semiconductor devices could be memory dies of a same kind (e.g., both NAND, both DRAM, etc.) or memory dies of different kinds (e.g., one DRAM and one NAND, etc.). In accordance with another aspect of the present disclosure, the semiconductor dies of the assemblies illustrated and described above could be logic dies (e.g., controller dies, processor dies, etc.), or a mix of logic and memory dies (e.g., a memory controller die and a memory die controlled thereby).

Figure 9:
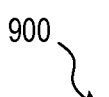
FIG. 9 illustrates a schematic view showing a system that includes a semiconductor device assembly configured in accordance with an embodiment of the present technology.
Figure 9:
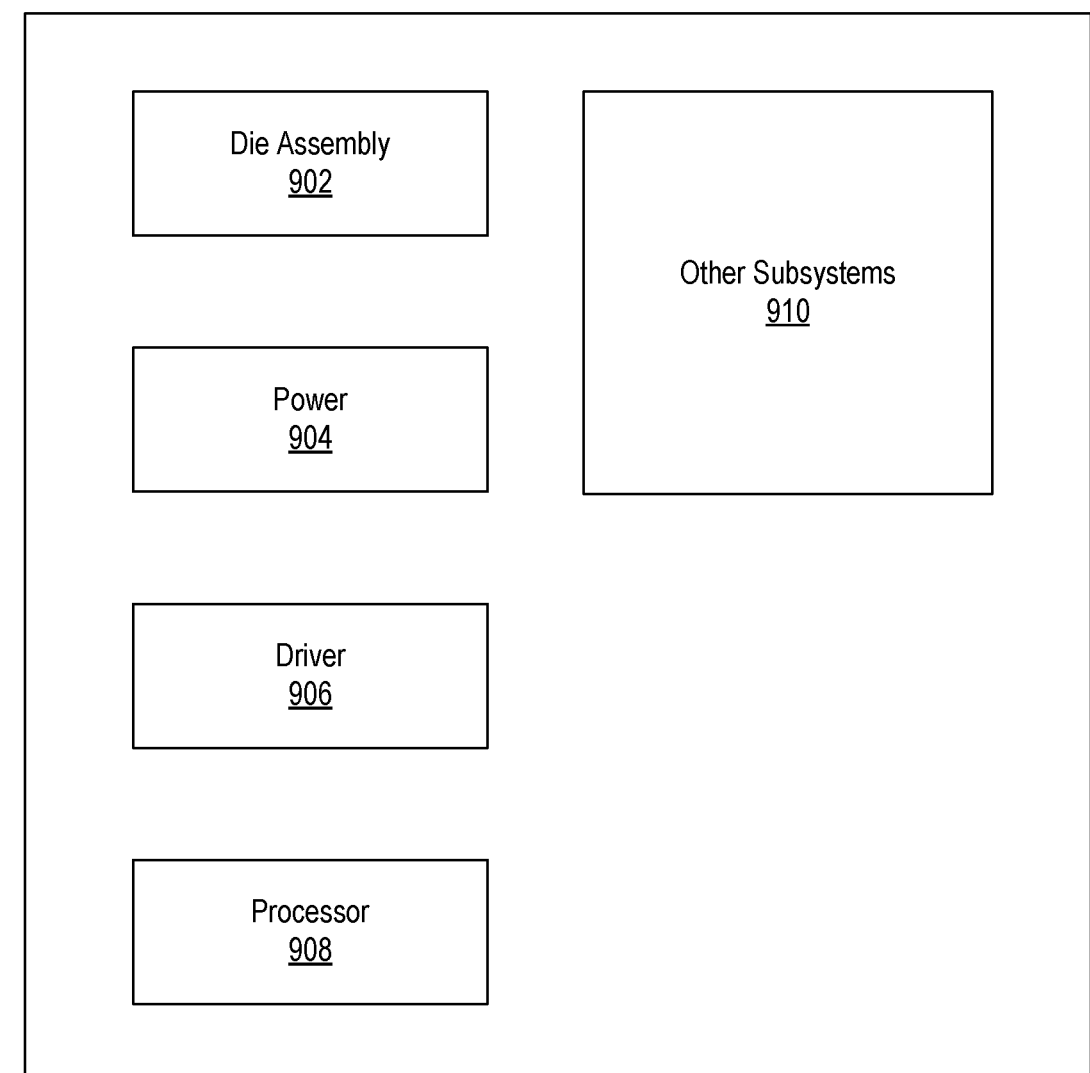

Any one of the semiconductor devices and semiconductor device assemblies described above with reference to FIGS. 2-8 can be incorporated into any of a myriad of larger and/or more complex systems, a representative example of which is system 900 shown schematically in FIG. 9. The system 900 can include a semiconductor device assembly 902 (e.g., or a discrete semiconductor device), a power source 904, a driver 906, a processor 908, and/or other subsystems or components 910. The semiconductor device assembly 902 can include features generally similar to those of the semiconductor devices described above with reference to FIGS. 2-8. The resulting system 900 can perform any of a wide variety of functions, such as memory storage, data processing, and/or other suitable functions. Accordingly, representative systems 900 can include, without limitation, handheld devices (e.g., mobile phones, tablets, digital readers, and digital audio players), computers, vehicles, appliances and other products. Components of the system 900 may be housed in a single unit or distributed over multiple, interconnected units (e.g., through a communications network). The components of the system 900 can also include remote devices and any of a wide variety of computer-readable media.

FIG. 10 illustrates an example method 1000 for fabricating a semiconductor device assembly in accordance with an embodiment of the present technology. The method 1000 may, for illustrative purposes, be described with respect to features, components, or elements of FIGS. 2-9. Although illustrated in a particular configuration, one or more operations of the method 1000 may be omitted, repeated, or reorganized. Additionally, the method 1000 may include other operations not illustrated in FIG. 10, for example, operations detailed in one or more other method described herein.

At 1002, a substrate 204 is provided. The substrate 204 includes a surface having a recessed slot. A contact pad 208 is located at the recessed slot to couple to a contact pad 206 on a die 202 vertically assembled on the substrate 204 at the recessed slot. The recessed slot may be created through a number of different techniques, for example, by etching the surface of the substrate 204 or by depositing material 510 at the surface of the substrate 204.

At 1004, a semiconductor die 202 is provided. The semiconductor die 202 includes an active surface at which circuitry is disposed. The semiconductor die 202 includes contact pad 206 that is configured to be coupled to the contact pad 208 when a side surface of the semiconductor die is disposed on the substrate 204 at the recessed slot.

At 1006, the semiconductor die 202 and the substrate 204 are coupled at the recessed slot. The semiconductor die 202 and the substrate 204 may be coupled such that the active surface of the die 202 is substantially orthogonal to the top surface of the substrate 204 and the contact pad 206 is electrically coupled to the contact pad 208. The contact pad 206 and the contact pad 208 may be electrically coupled through a connective structure to enable electrical signaling between the die 202 and the substrate 204. For example, the contact pad 206 may couple to the contact pad 208 through a solder joint 210 or through a pliable, conductive film 702. In general, however, the method 1000 may be performed to assemble a robust and efficient semiconductor device.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device assembly, comprising:
a substrate having a top surface with a recessed slot, wherein the recessed slot includes:
a bottom surface that is (i) inset from the top surface of the substrate and (ii) substantially parallel to the top surface of the substrate,
a first side surface that is (i) located at a first side of the bottom surface of the recessed slot and (ii) substantially orthogonal to the bottom surface of the recessed slot, and
a second side surface that is (i) located at a second side of the bottom surface of the recessed slot that is opposite the first side of the bottom surface of the recessed slot and (ii) substantially orthogonal to the bottom surface of the recessed slot, and wherein a first contact pad is disposed at the second side of the recessed slot; and
a semiconductor die having:
an inactive surface that is (i) substantially orthogonal to the top surface of the substrate and (ii) coplanar with the first side surface of the recessed slot,
an active surface that is (i) substantially orthogonal to the top surface of the substrate and (ii) opposite, and substantially parallel to, the inactive surface of the semiconductor die, and
a side surface that is (i) disposed in the recessed slot, (ii) positioned between the inactive surface and the active surface, and (iii) coplanar with the bottom surface of the recessed slot,
wherein a portion of the active surface of the semiconductor die that is disposed within the recessed slot comprises a second contact pad, and wherein the second contact pad is coupled to the first contact pad at the recessed slot.

2. The semiconductor device assembly of claim 1, wherein the first contact pad is located at:
the second side surface of the recessed slot; or
the bottom surface of the recessed slot.

3. The semiconductor device assembly of claim 1, wherein:
the first contact pad is disposed along the second side surface of the recessed slot.

4. The semiconductor device assembly of claim 1, wherein:
the first contact pad is disposed along the bottom surface of the recessed slot; and
the second contact pad is disposed on a portion of the first contact pad.

5. The semiconductor device assembly of claim 1, further comprising an intermediate material coupling the first contact pad to the second contact pad.

6. The semiconductor device assembly of claim 5, wherein the intermediate material comprises solder material.

7. The semiconductor device assembly of claim 5, wherein the intermediate material comprises a pliable film of conductive material located at the recessed slot.

8. The semiconductor device assembly of claim 1, wherein the substrate comprises a through-silicon via coupled to the first contact pad.

9. The semiconductor device assembly of claim 1, wherein:
the substrate further includes one or more additional recessed slots; and
the semiconductor device assembly further comprises one or more additional semiconductor dies coupled to the substrate at the one or more additional recessed slots.

10. A method of assembling a semiconductor device, comprising:
providing a substrate having a top surface with a recessed slot, wherein the recessed slot includes:
a bottom surface that is (i) inset from the top surface of the substrate and (ii) substantially parallel to the top surface of the substrate,
a first side surface that is (i) located at a first side of the bottom surface of the recessed slot and (ii) substantially orthogonal to the bottom surface of the recessed slot, and
a second side surface that is (i) located at a second side of the bottom surface of the recessed slot that is opposite the first side of the bottom surface of the recessed slot and (ii) substantially orthogonal to the bottom surface of the recessed slot, and wherein a first contact pad is disposed at the second side of the recessed slot;
providing a semiconductor die having:
an inactive surface that is (i) substantially orthogonal to the top surface of the substrate and (ii) coplanar with the first side surface of the recessed slot,
an active surface that is (i) substantially orthogonal to the top surface of the substrate and (ii) opposite, and substantially parallel to, the inactive surface of the semiconductor die, and
a side surface that is (i) disposed in the recessed slot, (ii) positioned between the inactive surface and the active surface, and (iii) coplanar with the bottom surface of the recessed slot, wherein a portion of the active surface of the semiconductor die that is disposed within the recessed slot comprises a second contact pad; and coupling the semiconductor die and the substrate at the recessed slot effective to:

align the active surface of the semiconductor die substantially orthogonal to the top surface of the substrate, dispose the side surface of the semiconductor die in the recessed slot, and couple the second contact pad to the first contact pad.

11. The method of claim 10, further comprising etching the substrate at the coupling surface effective to create the recessed slot.

12. The method of claim 10, further comprising depositing a material at the coupling surface effective to create the recessed slot.

13. The method of claim 10, further comprising coupling the first contact pad to the second contact pad through a solder joint.

14. The method of claim 10, further comprising coupling the first contact pad to the second contact pad through a pliable film of conductive material.

15. A semiconductor device assembly comprising:

a substrate including a top surface having a plurality of recessed slots, each recessed slot configured to receive a sidewall of a respective semiconductor die of a plurality of semiconductor dies;

a plurality of contact pads disposed in each of the plurality of recessed slots; and a plurality of through-silicon vias (TSVs) extending through the substrate and coupled to the plurality of contact pads, wherein a recessed slot of the plurality of recessed slots includes:

a bottom surface that is (i) inset from the top surface of the substrate and (ii) substantially parallel to the top surface of the substrate, a first side surface that is (i) located at a first side of the bottom surface of the recessed slot and (ii) substantially orthogonal to the bottom surface of the recessed slot, and a second side surface that is (i) located at a second side of the bottom surface of the recessed slot that is opposite the first side of the bottom surface of the recessed slot and (ii) substantially orthogonal to the bottom surface of the recessed slot, and wherein a first contact pad is disposed at the second side of the recessed slot; and wherein a semiconductor die of the plurality of semiconductor dies has:

an inactive surface that is (i) substantially orthogonal to the top surface of the substrate and (ii) coplanar with the first side surface of the recessed slot, an active surface that is (i) substantially orthogonal to the top surface of the substrate and (ii) opposite, and substantially parallel to, the inactive surface of the semiconductor die, and a side surface that is (i) disposed in the recessed slot, (ii) positioned between the inactive surface and the active surface, and (iii) coplanar with the bottom surface of the recessed slot, wherein a portion of the active surface of the semiconductor die that is disposed within the recessed slot comprises a second contact pad, and wherein the second contact pad is coupled to the first contact pad.

16. The semiconductor device assembly of claim 15, further comprising circuitry internal to the substrate coupling two or more of the plurality of contact pads.

17. The semiconductor device assembly of claim 15, wherein the plurality of contact pads are disposed at the second side surface of the recessed slot or the bottom surface of the recessed slot.

18. The semiconductor device assembly of claim 1, wherein the active surface of the semiconductor die is physically separated from the second side surface of the substrate.

19. The semiconductor device assembly of claim 18, further comprising:

an intermediate material that (i) is disposed on the bottom surface of the recessed slot and between the active surface of the semiconductor die and the second side surface of the substrate and (ii) couples the first contact pad to the second contact pad.

20. The semiconductor device assembly of claim 15, wherein the active surface of the semiconductor die is physically separated from the second side surface of the substrate.

* * * * *